(12) United States Patent
Baker et al.

(10) Patent No.: US 8,799,746 B2
(45) Date of Patent: Aug. 5, 2014

(54) ERASURE CODING AND REPLICATION IN STORAGE CLUSTERS

(75) Inventors: Don Baker, Austin, TX (US); Paul R. M. Carpentier, Boechout (BE); Andrew Klager, Austin, TX (US); Aaron Pierce, Austin, TX (US); Jonathan Ring, Austin, TX (US); Russell Turpin, Corpus Christi, TX (US); David Yoakley, Austin, TX (US)

(73) Assignee: Caringo, Inc., Austin, TX (US)

( * ) Notice: Subject to any disclaimer, the term of this patent is extended or adjusted under 35 U.S.C. 154(b) by 137 days.

(21) Appl. No.: 13/517,527

(22) Filed: Jun. 13, 2012

(65) Prior Publication Data
US 2013/0339818 A1  Dec. 19, 2013

(51) Int. Cl.
| G11C 29/00 | (2006.01) |
| H03M 13/05 | (2006.01) |
| H03M 13/25 | (2006.01) |
| G06F 11/10 | (2006.01) |
| G06F 11/14 | (2006.01) |

(52) U.S. Cl.
CPC ............. *H03M 13/05* (2013.01); *H03M 13/25* (2013.01); *G06F 11/10* (2013.01); *G06F 11/14* (2013.01)
USPC .......................................... 714/769; 714/762

(58) Field of Classification Search
None
See application file for complete search history.

(56) References Cited

U.S. PATENT DOCUMENTS

| 5,978,791 | A | 11/1999 | Farber et al. |
| 6,415,280 | B1 | 7/2002 | Farber et al. |
| 6,928,442 | B2 | 8/2005 | Farber et al. |
| 7,284,088 | B2* | 10/2007 | Frolund et al. ................ 711/114 |
| 7,373,345 | B2 | 5/2008 | Carpentier et al. |
| 7,552,356 | B1* | 6/2009 | Waterhouse et al. .......... 714/6.1 |
| 7,681,105 | B1 | 3/2010 | Sim-Tang et al. |
| 7,734,603 | B1 | 6/2010 | McManis |
| 7,802,310 | B2 | 9/2010 | Farber et al. |
| 7,945,539 | B2 | 5/2011 | Farber et al. |
| 7,945,544 | B2 | 5/2011 | Farber et al. |
| 7,949,662 | B2 | 5/2011 | Farber et al. |
| 8,001,096 | B2 | 8/2011 | Farber et al. |
| 8,090,792 | B2* | 1/2012 | Dubnicki et al. ............. 709/217 |
| 8,296,515 | B1* | 10/2012 | Saxena et al. ................ 711/114 |
| 8,504,535 | B1* | 8/2013 | He et al. ....................... 707/695 |
| 2003/0135700 | A1 | 7/2003 | Schultz et al. |

(Continued)

OTHER PUBLICATIONS

International Search Report in PCT/US2013/44042 mailed Aug. 30, 2013.

(Continued)

*Primary Examiner* — Daniel McMahon
(74) *Attorney, Agent, or Firm* — Beyer Law Group LLP

(57) ABSTRACT

A cluster receives a request to store an object using replication or erasure coding. The cluster writes the object using erasure coding. A manifest is written that includes an indication of erasure coding and a unique identifier for each segment. The cluster returns a unique identifier of the manifest. The cluster receives a request from a client that includes a unique identifier. The cluster determines whether the object has been stored using replication or erasure coding. If using erasure coding, the method reads a manifest. The method identifies segments within the cluster using unique segment identifiers of the manifest. Using these unique segment identifiers, the method reconstructs the object. A persistent storage area of another disk is scanned to find a unique identifier of a failed disk. If using erasure coding, a missing segment previously stored on the disk is identified. The method locates other segments. Missing segments are regenerated.

28 Claims, 10 Drawing Sheets

(56) References Cited

U.S. PATENT DOCUMENTS

| | | | |
|---|---|---|---|
| 2005/0283537 A1* | 12/2005 | Li et al. ..................... 709/240 |
| 2008/0247355 A1 | 10/2008 | Ahn |
| 2009/0006888 A1 | 1/2009 | Bernhard et al. |
| 2009/0228511 A1 | 9/2009 | Atkin et al. |
| 2010/0070515 A1 | 3/2010 | Dutton et al. |
| 2011/0029840 A1 | 2/2011 | Ozzie et al. |
| 2011/0040568 A1 | 2/2011 | Dutton et al. |
| 2011/0138136 A1 | 6/2011 | Shitomi et al. |
| 2011/0154092 A1 | 6/2011 | Dash et al. |
| 2011/0167045 A1 | 7/2011 | Okamoto |
| 2012/0042202 A1 | 2/2012 | Wenzel |
| 2012/0047111 A1 | 2/2012 | Hayden et al. |
| 2012/0060072 A1 | 3/2012 | Simitci et al. |
| 2012/0266044 A1* | 10/2012 | Hu et al. ..................... 714/763 |

OTHER PUBLICATIONS

Written Opinion in PCT/US2013/44042 mailed Aug. 30, 2013.
International Search Report in PCT/US2013/44045 mailed Sep. 25, 2013.
Written Opinion in PCT/US2013/44045 mailed Sep. 25, 2013.
International Search Report in PCT/US2013/043904 mailed Oct. 10, 2013.
Written Opinion in PCT/US2013/043904 mailed Oct. 10, 2013.

* cited by examiner

| Metadata 310 | Zfec 1.4 | | ~312 |
| --- | --- | --- | --- |
| | 5:7 | | ~314 |
| | 32,000 | | ~316 |
| Erasure Set One 340 | Size | 1,000 | ~342 |
| | Encoding | 5:7 | ~344 |
| | Segment Width | 32k | ~346 |
| | Segment Size | 296, 112 | ~348 |
| | Segment VVIDS | | |
| | abcdef1234567890<br>1234567890abcdef<br>abcdef123abc4567 | | ~350 |
| Erasure Set Two 380 | Size | 887 | |
| | Encoding | 5:7 | |
| | ⋮ | | |

Manifest

ERASURE CODING AND REPLICATION IN STORAGE CLUSTERS

CROSS-REFERENCE TO RELATED APPLICATIONS

This application is related to U.S. patent application Ser. No. 13/517,523 filed on the same date herewith, entitled "TWO LEVEL ADDRESSING IN STORAGE CLUSTERS" and to U.S. patent application Ser. No. 13/517,525 filed on the same date herewith, entitled "ELIMINATION OF DUPLICATES IN STORAGE CLUSTERS," both of which are hereby incorporated by reference.

FIELD OF THE INVENTION

The present invention relates generally to erasure coding. More specifically, the present invention relates to a combination of erasure coding and replication in a fixed-content storage cluster and to volume failure recovery when using erasure coding.

BACKGROUND OF THE INVENTION

Traditionally, storage provided in a storage cluster (such as by using a redundant array of independent nodes, or RAIN) is made reliable against hardware failure either through replication of stored objects or erasure coding of stored objects. The former has the advantage that the same unique identifier can access the multiple replicas (using a journal and RAM-based indexing scheme, for example), but has the disadvantage of high bandwidth and storage overhead (depending upon the number of replicas desired, large objects can take up a significant amount of space). The latter enjoys the benefit of a smaller storage footprint and less overhead for similar level of protection against media failures, but suffers from the drawback that each segment of an erasure set is different content that must be separately identified in order to read the object or to reconstruct any lost segments. This identification can be especially problematic when a storage cluster is restarted. Erasure coding will also incur a higher processing overhead and lose its footprint advantage when storing small objects.

Thus, both techniques have disadvantages. Further, some prior art approaches applicable to erasure coding use a control database separate from the storage cluster in order to identify and track segments of a particular object; this approach is problematic because it introduces more overhead and calls into question the availability of this control database and whether or not it needs to be replicated. Also, even though under erasure coding an object can be reconstructed using a subset of the segments used to encode that object (e.g., if there had been a disk failure), it can be time consuming not only to identify which segments are no longer present, but also to locate the remaining segments.

Accordingly, improved techniques are desired for use with storage clusters in order to take advantage of the benefits of replication and erasure coding as well as to limit exposure after a hardware failure.

SUMMARY OF THE INVENTION

To achieve the foregoing, and in accordance with the purpose of the present invention, a storage cluster is disclosed that combines both object replication and erasure coding in order to utilize the advantages of each.

In one embodiment, a method stores a digital object in a storage cluster. First, the storage cluster receives from a client application a request at a computer node of the storage cluster to store a digital object. The storage cluster then determines whether to store the digital object in the storage cluster using replication or erasure coding. This determination may be made by reference to an instruction from the client, an inherent property of the object, the metadata of the object, a setting of the cluster, or by other means. When it is determined to store the digital object using erasure coding, the storage cluster writes the digital object to a number of computer nodes of the storage cluster using erasure coding and the digital object is stored as a plurality of segments. In addition, a manifest computer file is created that includes an indication of the erasure coding and a unique identifier within the storage cluster for each of the segments. The storage cluster then stores the manifest computer file on one or more nodes of the cluster and returns a unique identifier of the manifest computer file to the client application. Manifests are distinguishable from other digital objects.

In another embodiment, a method reads a digital object from a storage cluster having a plurality of computer nodes. First, one of the computer nodes within the storage cluster receives a request from a client application that includes a unique identifier for the digital object. The storage cluster finds the object so identified on one of the nodes where it is stored. If the object is not a manifest as described above, it is returned to the client application. If the object is a manifest, it next identifies a plurality of segments within the storage cluster using unique segment identifiers found within the manifest. Using these unique segment identifiers, the method reconstructs the digital object using the segments and an erasure coding algorithm. Finally, the method returns the digital object to the client application.

In another embodiment, where the client application wishes to replace the content associated with a unique identifier with a new version of the content, the invention behaves as described in the previous paragraph, to find the object, then as in the paragraph prior, to write it. The new version will retain the previous version's unique identifier, but have a later creation timestamp, which distinguishes the two versions during the update process. The older version is deleted once the newer version is successfully written in the cluster. The health processing module may also delete older versions of objects for which newer versions are present, as a way of maintaining cluster data from error states.

In another embodiment, a method recovers from a failed disk. First, the method detects within a storage cluster (having a plurality of computer nodes) that a disk of one of the nodes has failed. Next, the method scans a persistent storage area of another disk of the storage cluster in order to find a unique identifier of the failed disk; this unique identifier is in association with a digital stream of the storage cluster. It is then determined whether the digital stream is stored within the storage cluster using replication or erasure coding; when it is determined that the digital stream is stored using erasure coding, the method identifies a missing segment previously stored on the failed disk. Using sibling identifiers from the digital stream, the method locates a plurality of other segments within the storage cluster. Next, the method regenerates the missing segment using a number of the other segments and an erasure coding algorithm. Finally, the method stores the regenerated segment on a computer node of the storage cluster.

In another embodiment, a segment may be relocated within a storage cluster without the need for an extra control computer or control database. When a segment is relocated, the volume hint in its upstream sibling segment is updated in the metadata of the sibling segment. Alternatively, the volume hint is updated in the stream representation of the sibling segment in its journal on disk. The storage cluster may broadcast the unique identifier of the sibling segments in order to find the disk where the sibling segment is located. The manifest may also be used to find an upstream segment or a sibling segment of the segment that is being relocated.

In other embodiments, metadata stored with an object or within cluster settings dictates when an object should be converted to a different format. When a triggering condition is satisfied, the cluster converts the object from a storage using replication to an erasure coding format, from one erasure coding format to another, or from an erasure coding format to a replication storage format. The original object in its old format may be deleted if desired. Advantageously, the unique identifier used with the original object is retained for use with the object in its new storage format, thus ensuring that the client application that originally stored the object may retrieve it at any future date using the original unique identifier with which it was provided.

In another embodiment, an object may be moved from one storage cluster implementing one storage format (e.g., replication, the specific erasure coding, etc.) to a second storage cluster that does not necessarily implement the same storage format. When moved, the object will be automatically converted into the storage format used by the second cluster. Conversion of the object may be dictated by default settings in the second storage cluster, by user metadata of the object (which trumps cluster settings), or by an instruction from a program initiating the move.

In general, an extra control database is not needed with any of the embodiments of the present invention. Inherently, a digital object stored within the cluster can be written, read and managed using its unique identifier, irrespective of whether the object is stored using replication or erasure coding.

BRIEF DESCRIPTION OF THE DRAWINGS

The invention, together with further advantages thereof, may best be understood by reference to the following description taken in conjunction with the accompanying drawings in which:

FIG. 3 presents an example manifest that may be used in embodiments of the invention.

DETAILED DESCRIPTION OF THE INVENTION

Figure 1:
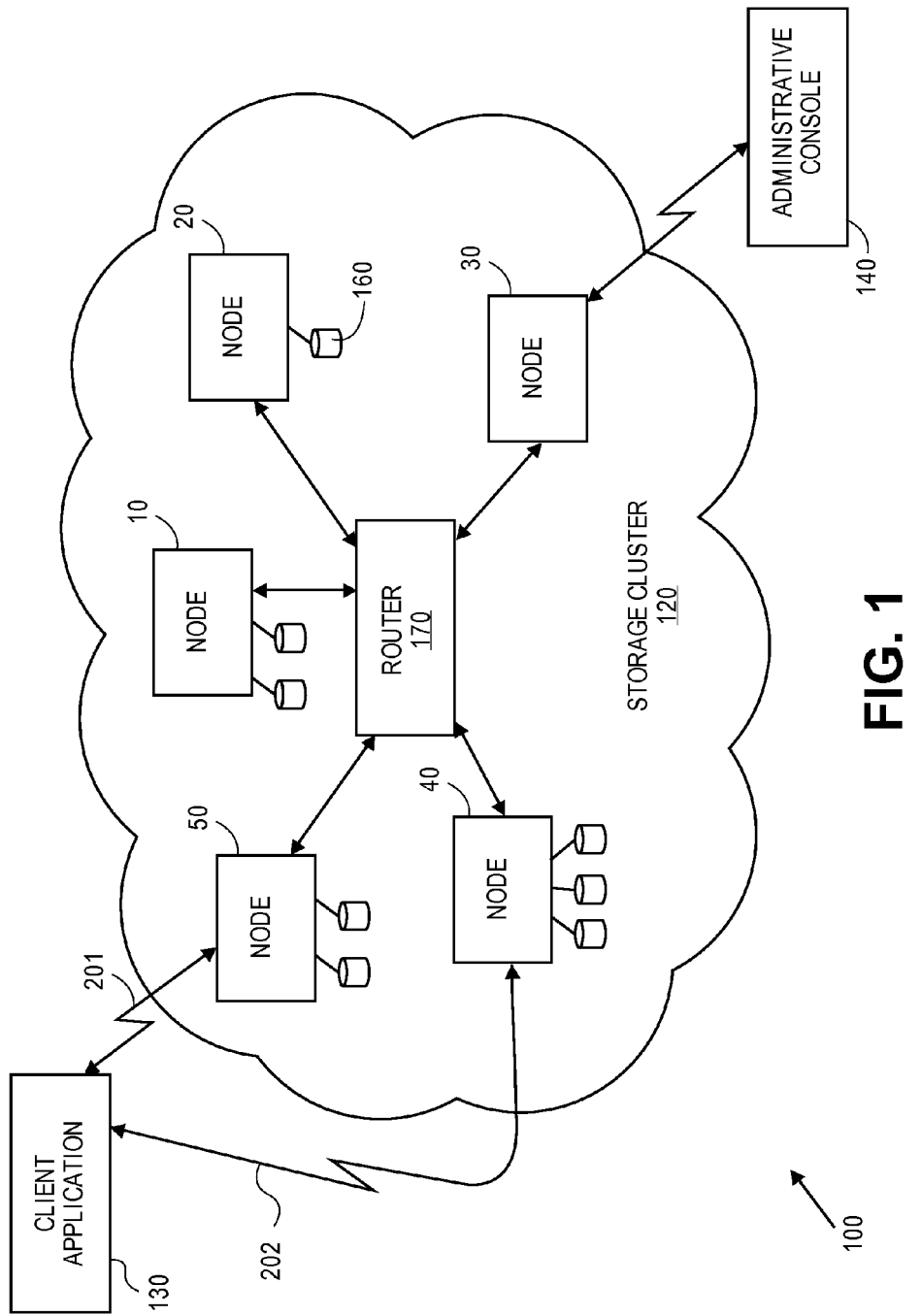
FIG. 1 illustrates an environment for operation of the present invention.

As is known in the art, erasure coding is a technique for providing redundancy of a data object without the overhead of replication. Given a particular data object, erasure coding breaks the object into K data segments and from those data segments generates P parity segments, for a total of M segments in an erasure set, commonly indicated as a K:M erasure code. For example, a data object broken into 5 segments which are then used to generate 2 parity segments is referred to as using a 5:7 erasure code. A key property of erasure codes is that the original object can be reconstructed from any K segments, whether a segment of an erasure-coded object is an original data segment or one of the parity segments. Accordingly, it is advantageous to distribute each segment to different volumes within a storage cluster (and to different nodes), thus protecting the data object against the loss of any two volumes within the cluster. Given adequate nodes in the cluster, segments are distributed to different nodes, providing protection against node loss. If nodes are located in different geographic regions, segments are distributed evenly among the regions to protect, to the extent possible, against loss of the portion of a cluster in one geographic locale.

In one embodiment, the invention allows objects to be stored either using replication or erasure coding. The cluster may switch back and forth on a per object basis depending upon instructions from a client application, an object's category, an object's size, an object's metadata, etc. For example, relatively large objects may all be stored using erasure coding, while relatively small objects may all be stored using replication. Ordinary replication may be viewed as a special case of erasure coding where K=1 and where M is equal to the total number of replicas of a given object. Also, different objects may be assigned different erasure codings. In the case of very large objects, several such erasure sets may be used to represent the object. By allowing different objects to be assigned different encodings, including ordinary replication, the invention allows different levels of protection against data loss, at different processing costs and storage footprints.

In a second embodiment, the invention addresses the problem with trying to identify and find segments of an object under erasure coding. Instead of using a separate database, a manifest file (or object) includes a description of each segment associated with a particular object. Included within the manifest are the unique identifier within the cluster for each segment, the size of each segment, which encoding algorithm is used and the specific erasure coding (5:7, etc.) for the object. The manifest is then treated as an ordinary object within the cluster, provided with a unique identifier, and replicated as required (e.g., replicated to the same degree of redundancy, P+1). Replication of the manifest is simple because the cluster is already performing replication for other objects and has little storage overhead because the manifest is relatively small in size. Thus, the segments of a particular erasure-coded object are quickly and easily accessible via the manifest. The identifier for this manifest object is returned to client applications for future retrieval of the object. This provides the efficient footprint of erasure coding, while preserving the simple identification, high availability, and fast startup of ordinary replication.

In a third embodiment, the invention addresses exposure to data loss within a storage cluster by minimizing the time after a hardware failure before all missing segments are regenerated. Each segment of an erasure-coded object includes a hint as to the volume identifier within the cluster that holds the next segment of the object. The hint is likely to be the correct volume identifier but may not be guaranteed. As soon as a hardware failure occurs (such as a disk failure), and before it is noticed that a particular segment is missing, each volume within the cluster will scan its journal on disk in order to find a segment having as its hint a volume identifier for the failed volume. Thus, any missing segments can be identified and can be regenerated as quickly as possible, before waiting for any normal integrity checking of the cluster to occur.

Storage Cluster Example

As mentioned above, the present invention applies to digital objects, i.e., any type of information represented in digital form. For instance, a digital object may be an electronic representation of information such as a computer file, a group of files, a group of file identifiers, or the collections of data or database information. Such other collections of data include frames or clips from digital audio or video streams, digital photographs, scanned paper documents, voice messages, CAD/CAM designs, MRI or X-ray data, streams from message records or files, log entries from audits or status logs of systems, e-mail archives, check images, etc. The term "computer file" is often used herein to encompass any electronic representation of information.

The present invention may be implemented using any suitable computer hardware and software, and may be implemented upon a storage cluster that includes any number of computer nodes. Preferably, each node includes a CPU (or multiple CPUs), an operating system, communication links to the other nodes (or, to at least a central router), and any number of internal hard disk drives or solid-state drives (i.e., from zero to N), often referred to as volumes. Typically, each node includes at least one drive and there may be any combination of hard disk drives along with solid-state drives. A storage cluster is typically a fixed-content cluster, meaning that it is used for backups, long-term storage, archiving, etc., and is not typically used for day-to-day access to computer files. Often referred to as WORM (write once, read many) storage, this means that once a computer file or digital object is written to the cluster it cannot be changed. (Of course, the file may be deleted and a modified version of the computer file may also be stored within the cluster.) A cluster may be implemented as a redundant array of independent nodes (a RAIN) meaning that each node runs its own operating system and makes independent decisions about storage within the cluster. Storage clusters may be built upon blades, towers, personal computers and servers. Alternatively, a multi-core processor within a single computer box may support a virtual storage node running on each core, meaning that a storage cluster having multiple nodes may be present within the single computer box. Further, a computer system inside a single physical box may include multiple CPUs in which case each CPU may represent a node and the storage cluster may be implemented within the single physical box.

FIG. 1 illustrates an environment 100 for operation of the present invention. Included is a storage cluster 120, a client application 130, an administrative console 140, any number of computer nodes 10-50, and a central router 170. As mentioned above, a computer node is typically a physical file server that preferably includes at least one CPU and any number of disk drives 160, solid-state drives or hybrid drives that have both types. In one particular embodiment, the storage cluster 120 may be further logically or physically divided into sub clusters. For example, nodes 40 and 50 may be considered one subcluster, while nodes 10, 20 and 30 may be considered a second subcluster. Division of a cluster into sub-clusters may be advantageous where one subcluster is located in a different geographic location from another subcluster.

Each node implements an operating system such as Debian Linux and executes processes to manage peer-to-peer communications between nodes, to perform health processing, and to make independent decisions on behalf of the node and its volumes. Each node also includes administrative software and its status can be viewed via a web browser over the Internet. In one particular RAIN embodiment, each node is a 1U server (e.g., an x86 computer) with 1 terabyte or more of serial ATA disk storage capacity with standard Ethernet networking. Each node has an IP address and may be physically interconnected using an IP-based LAN, MAN or WAN. Thus, each node may talk to a single node or may broadcast a message to all nodes within the storage cluster (a multicast) using a router 170 or other similar network switch.

Each node includes a management module for handling external requests from client applications (e.g., an SCSP request from client 130), replication requests between nodes (e.g., interSCSP requests), and other internode protocol communications (bidding, requests for information, etc.). A health processing module manages the digital content of each node. The administrative console 140 is preferably a Web server linked to the storage cluster that allows access to each node over any suitable Internet connection. Each node implements a redundant administrative console which can be used to view and administer the entire cluster. In certain embodiments, all nodes are considered equal and communicate with each other by periodically broadcasting (or "multicasting") their relevant information to all other nodes within the cluster.

In one embodiment, a storage cluster may be implemented using content storage software available from Caringo, Inc. of Austin, Tex. (as modified as described herein), and any suitable computer hardware. In this embodiment, a storage cluster implements fixed-content content-addressable storage and each digital object is uniquely addressed within the cluster by a random number (a universally unique identifier, or UUID) that has been generated for that digital object using a random number generator. The contents of each digital object may be verified using a hash function. A client software application receives the UUID when storing a digital object in the cluster and retrieves that digital object by supplying the UUID to the cluster. Software applications communicate with a CAStor cluster using standard HTTP 1.1, and more specifically, using a simplified subset of the standard called Simple Content Storage Protocol (SCSP). Using this standard interface, client applications such as electronic mail, enterprise content management, health care applications, Web browsers, Web 2.0 sites, photo sharing, social media sites, security video, video editing, etc., may access the CAStor storage cluster in order to store files, retrieve files or delete files. Further, direct HTPP access is available for browsers, JAVA, Python, C++, and other software environments.

In one embodiment, a digital object is stored on a particular node in the following way. Each node includes a disk index in RAM listing where a digital stream including the object is stored on disk based upon its unique identifier. For example, a first column of the index lists the unique identifier of the object, a second column lists at which sector the stream starts and a third column lists either the length of the stream or the sector in which it ends. A stream may include the digital object as well as relevant metadata. Accordingly, objects to be stored on a node may simply be written sequentially to the disk and their locations recorded in the RAM index. Or, objects may be stored anywhere on the disk using any suitable storage algorithm and the objects' locations again will be recorded in the index. When an object is to be read or deleted, its location on the disk may be found by consulting this index. To facilitate building up this RAM index upon a restart of the node, a journal of the node stored within persistent storage records whenever an object is added or deleted and includes the unique identifier for the object, the sector at which it starts, its length in sectors or bytes, and other information as described below. Accordingly, when the node is restarted the information in the journal is read and is used to create the disk index in RAM. Another technique to build up the index instead of using a journal is to read the entire disk upon a restart in order to gather the necessary information although this will be more time consuming.

Objects may be stored, and duplicates deleted, as described in "Two Level Addressing in Storage Clusters" and "Elimination of Duplicates in Storage Clusters" referenced above.

Erasure Set Example

Figure 2:
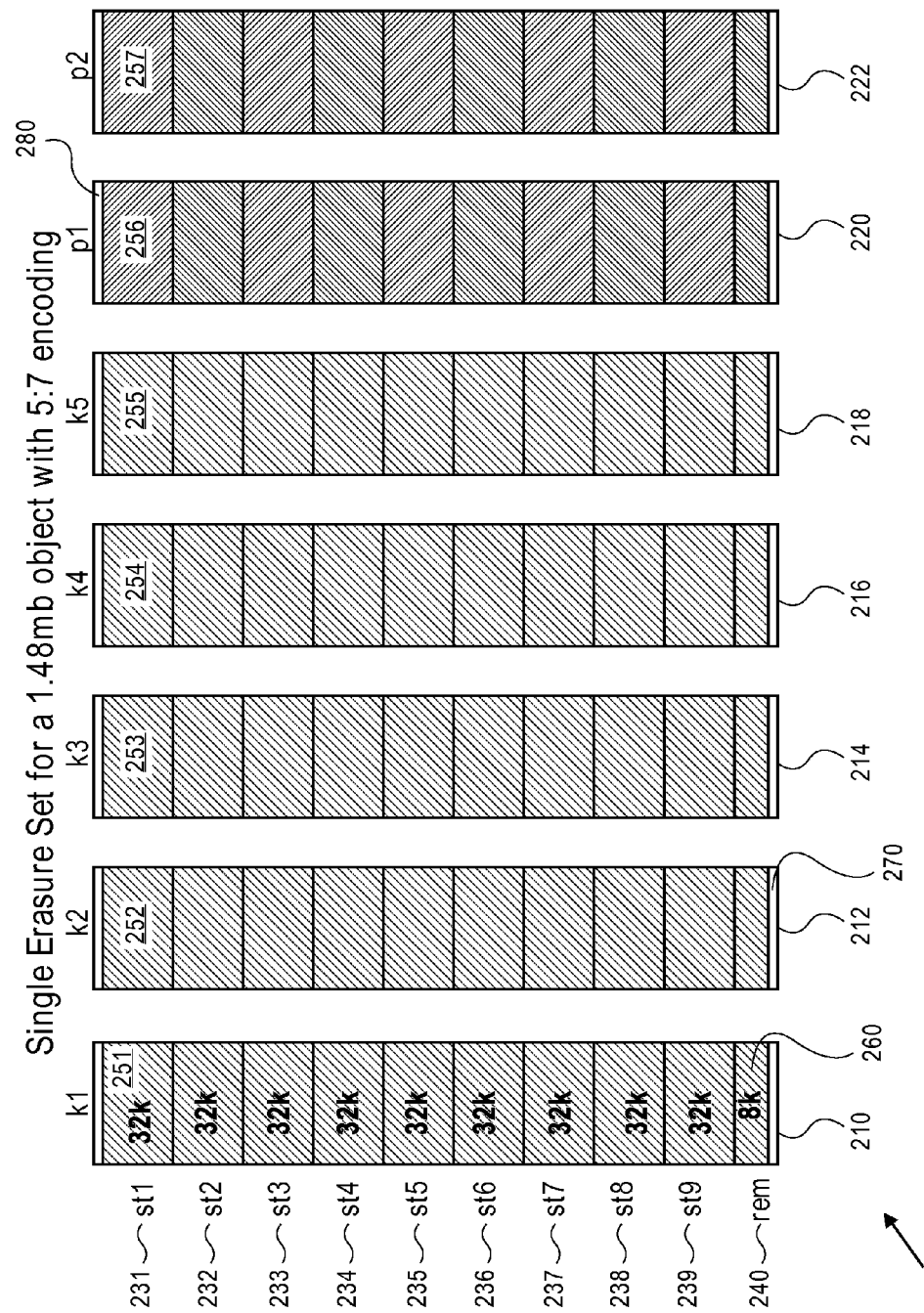
FIG. 2 illustrates an example erasure set for an object using 5:7 erasure coding.

FIG. 2 illustrates an example erasure set 200 for an object using 5:7 erasure coding. As shown, the data of the original object is separated into five data segments (k1-k5) 210-218, from which are generated two parity segments (p1 and p2) 220 and 222. In one embodiment, the data is written, and the parity is generated, in stripes (st1-st9) 231-239. For example, the first stripe 231 consists of original data 251-255 from which are generated parity data 256 and 257. Any remaining data is formed in a final remainder stripe (rem) 240 and hash metadata may be stored at the end of each segment in a section 270.

As mentioned earlier, an object (or stream) to be stored within the cluster may be broken into several erasure sets of a given size, the size being chosen for performance sake. A very large object may be broken into several erasure sets, for example. Within an erasure set the K data segments and the P parity segments are written using stripes with a fixed-size block of data written successively into each of the K data segments and then generating and writing the parity blocks to each of the P parity segments, each stripe (across the K+P segments) serving as an erasure coding unit. The last stripe in a segment (remainder stripe 240, e.g.) may have a smaller block size that can be readily computed. Stripes are typically written until the incoming data is exhausted or until the given size for the erasure set has been filled, with subsequent data starting a new erasure set.

In a specific embodiment, data from a single write operation is written in stripes across all K segments of the erasure set in fixed-size blocks (e.g., 32 k bytes). In other words, blocks 1, K+1, 2K+1, etc., are written to the first segment 210, blocks 2, K+2, 2K+2, etc., are written to the second segment 212, etc. The P parity blocks are generated synchronously as part of the generation of each stripe of data and are incrementally written at the end of each stripe. Striping allows parity segments to be generated synchronously with predictable memory overhead and also allows the writing of chunked-encoded streams, which usually do not provide the content length at the beginning of the write operation. Of course, the original data object need not be divided up into stripes in order to perform the erasure coding, but this provides some efficiency as the parity segments can be generated for each stripe and then move on to the next stripe. Alternatively, if striping is not used, the first data segment 210 would include the first blocks of data within the data object, the second data segment 212 would include the next set of blocks of data, and so forth. At the end of each segment in the set is metadata 270 for each segment which includes an MD5 hash value for that segment. For example, each hash value is 16 bytes and written without separators.

Each segment of an erasure set is an immutable stream, each having its own unique identifier, just as with any other stream of the cluster. Each erasure segment also contains an additional header 280 containing metadata concerning the other segments in the erasure set, such as the unique identifier of its manifest, and the unique identifiers of all of the data and parity segments, in order. Each segment's own unique identifier will identify its place in its set of siblings. The header for each segment will also include system metadata such as the volume identifier where the segment is located, and the likely volume identifier for the next segment of the erasure set (the volume hint). For example, segment k4 includes the volume identifier where the segment k5 is located, segment p2 includes the volume identifier were the segment k1 is located, etc. Preferably, each erasure set being part of a larger stream (representing a single object) will have the same erasure coding, e.g., 5:7 for all erasure sets.

During a write operation, each of the seven segments shown may be written in parallel using seven different nodes of the cluster, thus providing for data protection should a node or volume fail. Once a segment is written to a volume, it may be treated like any other stream within the cluster (aside from the volume and its contents, its recovery process, and the fact that it need not be replicated).

Manifest Example

FIG. 3 presents an example manifest 300 that may be used in embodiments of the invention. As mentioned earlier, once erasure coding has been used to encode a data object into any number of segments (depending upon the encoding used), the unique identifiers for those segments may be stored within a manifest (it itself being an object stored within the cluster and having its own unique identifier) for later retrieval.

Included within each manifest is a metadata section 310, at least one erasure set 340 and any number of other erasure sets 380. Of course, the number of erasure sets represented within the manifest depends upon the size of the data object, the size of each segment, and the encoding scheme used. Section 312 of the manifest provides the name of the erasure coding algorithm used and its version number. The specific erasure coding is shown in section 314 and the size of each data block (stripe width) within a segment is shown in section 316. Other information in this metadata section includes the time the object was written, its unique identifier, its ownership, and metadata specified by the application.

The representation of the first erasure set (or the only erasure set) includes its size 342, the erasure coding used for this erasure set 344, the segment width 346 (in bytes), and the total segment size 348 (in bytes). Information such as the encoding and segment width may also be present within each erasure set as well as in metadata section 310 in order to provide flexibility, or such data may only be present in one area.

The first erasure set also includes the unique identifiers for each of the segments in that erasure set. For example, section 350 shows unique identifiers for the segments in the first erasure set. As mentioned, the manifest may contain one or more erasure set. In that situation, representation of a second erasure set 380 may be included as well as any number of other representations of other erasure sets. The second erasure set shows the size (that may be different from the first set) an encoding, and similar information as the first erasure set. The second erasure set may use the same encoding as the first set, as well as segment width and segment size, but this is not a general requirement.

Any additional erasure sets will include the unique identifiers for all segments included within that erasure set. Preferably, manifests themselves are replicated and not erasure coded. This will not hurt space efficiency because a manifest only uses a small fraction of the space of the data object for which it is a manifest. In addition, in order to offer the same protection against simultaneous disk failures as the erasure encoding of the erasure sets, the manifest for a data object encoded using K:M (P=M−K) encoding should have a total number of replications of at least P+1.

Write Digital Object to Cluster

Figure 4A:
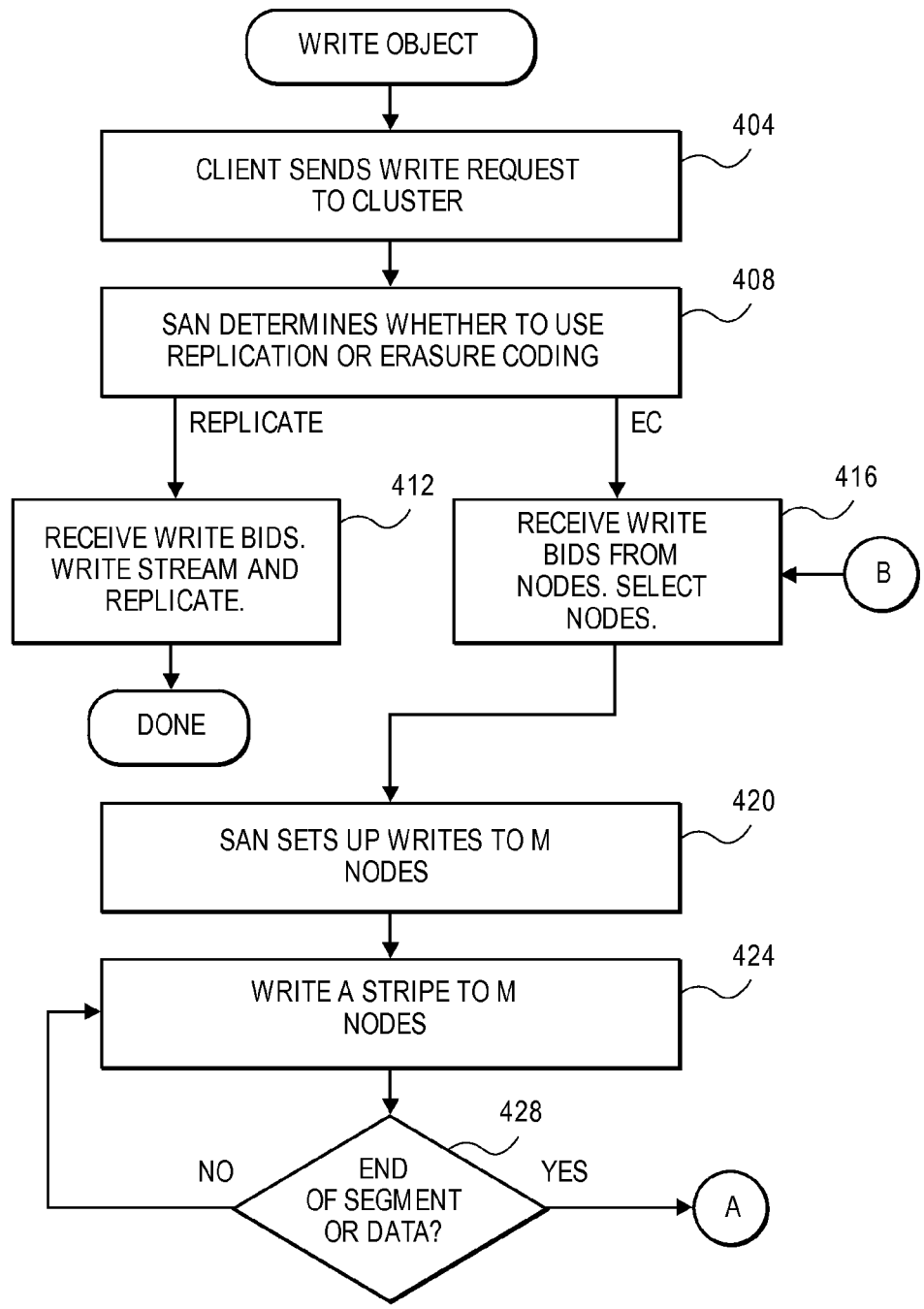
FIGS. 4A and 4B are a flow diagram describing how a client application writes a file to the storage cluster.
Figure 4B:
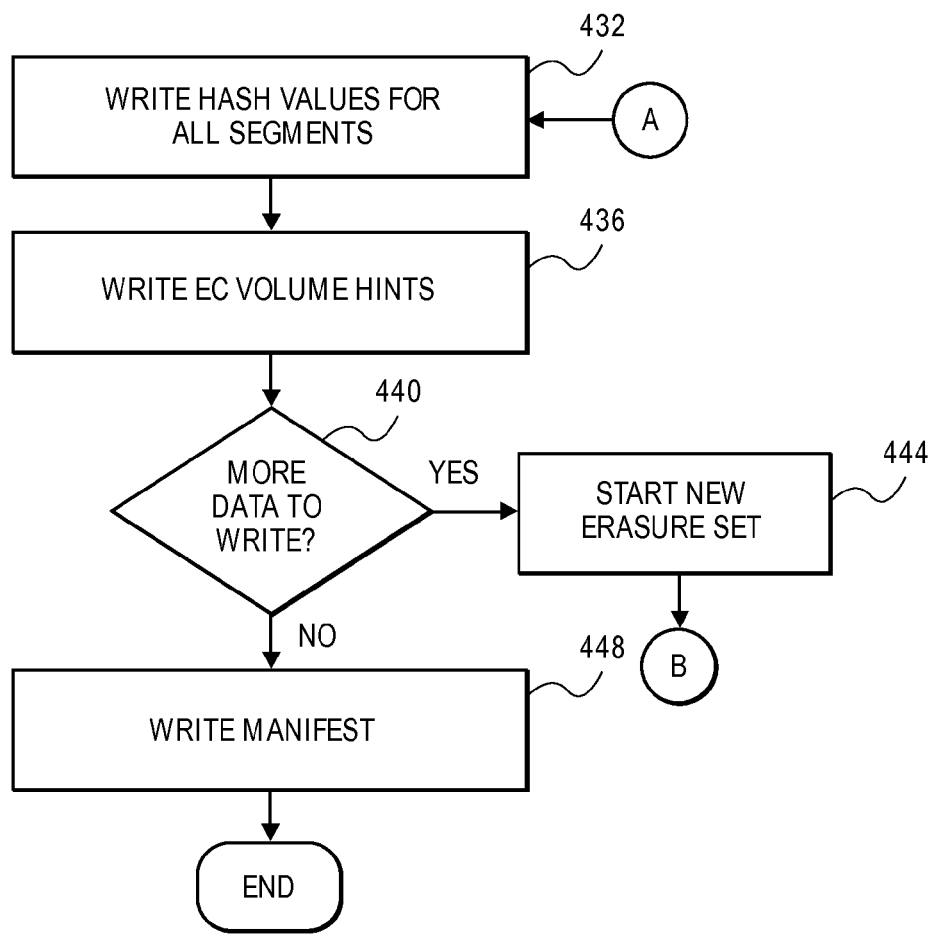

FIGS. 4A and 4B are a flow diagram describing how a client application writes a file (a digital object) to the storage cluster. In step 404 any suitable client application 130 desires to store a digital object (such as any computer file, digital image, digital movie, health record, etc.) in the storage cluster 120. The client application discovers or obtains an IP address of one of the nodes 10-50 within the cluster and chooses that node as the primary access node (PAN) with which to begin the storage process. Typically, a client application will access the last node used for its next request to write. The client application sends a request to the PAN to store the digital object. In one embodiment, this request is an HTTP POST request that includes a header, length in bytes of the digital object, and the object itself. The response to this request from the PAN to the client will be one of: yes, the PAN can facilitate storing the object; no, here is a better node to store the object; or no, no node within this cluster can store that object.

Assuming that the PAN will facilitate storing the object, the client has passed the digital object to be stored at this time, although it is possible to wait until a secondary access node (SAN) is selected for storage to pass the object. If the object is not passed initially, the client may pass object metadata such as the size of the object, whether long-term or short-term storage is desirable, and whether the object will be accessed frequently in the future (all of which can aid in the selection of a storage node), and optionally a file name for the object. Some clients require that a hierarchical or arbitrary file name be used for objects that the client stores within the cluster, and in these situations a hash value may be derived from such a file name and used as the unique identifier.

More relevant to this invention, though, is object metadata that may be used to determine whether to store the object using replication or erasure coding. With the write request, or in the object metadata, the client application may specify that this object should be stored using replication or erasure coding (and may also specify a particular erasure coding). In fact, the client may specify that all objects to be written be stored using replication or erasure coding. In the absence of a specific instruction from the client, the invention may use any of a variety of information in order to decide whether to select replication or erasure coding for an object. For instance, the size of the object may be used (objects above a certain size being stored using erasure coding), the type of object may be used (image file, text information, health record, etc.), object ownership, and expected lifespan. Additional metadata used to determine when and whether to convert an object after a write is discussed below.

In step 408, once the secondary access node (SAN) has been selected, the SAN decides whether to use replication or erasure coding in order to store the current object. As mentioned above, the SAN may use instructions from a client application or may use any suitable rule based upon the object metadata in order to make this decision. In one particular embodiment, the size of the digital object is used as the criterion, or specifically, an object the size of less than 10 megabytes will be replicated, but any larger objects will be stored using erasure coding. In general, information that may be used to determine whether to use replication or erasure coding includes: any rules or settings of the storage cluster set by the cluster administrator; any inherent property of the object itself or of its metadata; and the nature of the query or any instructions from the client application. Should replication be chosen, in step 412 the SAN requests and receives any number of write bids from nodes within the cluster for the writing of the digital object.

If the SAN has the lowest bid it responds by sending a "continue" message back to the client application. In response, the client sends the digital object to the SAN and the SAN stores the digital object, calculates a unique identifier and returns this identifier to the client application. On the other hand, if the SAN loses the bid, then the SAN redirects the client application to the node with the lowest bid that will then handle the request. The client application then sends the same write request to this node and the node responds by sending a "continue" message back to the client application. In response, the client sends the digital object to the node and the node stores the digital object, calculates a unique identifier and returns this identifier to the client application. Calculation of write bids may be performed as described in application Ser. No. 12/839,071 entitled "Adaptive Power Conservation" which is hereby incorporated by reference. Alternatively, a digital object may be written as described above in the application entitled "Two Level Addressing in Storage Clusters." After the object has been written, it may be replicated to different nodes immediately as many times as required, or the cluster may wait for periodic integrity checking in order to replicate the object.

On the other hand, if erasure coding is chosen for storage of the object within the cluster, then in step 416 the SAN issues a request for write bids from all of the nodes within the storage cluster. Once the SAN has determined the specific erasure coding to be used (K:M, based upon a client instruction, object metadata, or a cluster system setting or constant), it will then select M nodes to be used for storing the data and parity segments of the digital object. Preferably, the SAN chooses nodes bidding with the lowest cost, although other techniques may also be used such as the best performance, the lowest power consumption, or other criteria.

In one embodiment, in order to reduce risk, nodes may be chosen within different sub-clusters that are physically separated, in order to ensure that if one sub-cluster is lost that entire objects may be regenerated from segments within the remaining sub-clusters. For example, given three sub-clusters, an object encoded with 4:6 encoding, will have its segments distributed so that two are stored in each of the three sub-clusters. The loss of any one sub-cluster leaves four segments, adequate to reconstruct the object. Similar schemes are possible for different numbers of sub-clusters.

Next, in step 420 the first node to store the first data segment of the object will be designated and this node will perform a number steps in order to prepare for erasure coding of the object into the data and parity segments on the different nodes. For instance, the SAN will choose unique identifiers for all of the data and parity segments in the erasure set (e.g., using a random number generator), will set up chunked encoded POSTS to the M node recipients, and will determine a maximum segment size at the beginning of the write which will limit the size of this erasure set. The maximum segment size may be determined by reference to a storage cluster setting. Each node returns volume information for its segment on a response to the SAN.

Next, in step 424 the client application begins transferring the data object to the SAN which will write the data to each data segment on the different nodes in a stripe and will compute the data for the parity segments using a suitable erasure coding algorithm. In one embodiment, the Zfec algorithm has been found to work well. For example, referring to FIG. 2 and assuming a 5:7 encoding, the first 32 k block of the object received will be written to data segment 210 on the first node (the SAN), the second 32 k block will be written to data segment 212 on the second node, etc. After the fifth data block has been written to the fifth node, the two parity blocks will be computed and stored in segments 220 and 222 in the last two selected nodes of the cluster. The digital object continues to be read from the client application and written to the M selected nodes in the storage cluster stripe-by-stripe until either the end of the object is reached or the end of the segment is reached, test 428. A remainder stripe 240 may be written as shown if there is not a full data block to be written. Once the end of the segment is reached (but remaining data in the object still needs to be written) or the entire object has been written to the M segments, then control moves to step 432 of FIG. 4B.

Next, in step 432 the SAN optionally calculates a hash value for each segment based upon the data of each segment and send these values 270 (for example) as trailing data to all of the selected nodes that are writing segments to their volumes. Each node will compare this received hash value from the SAN with one it computes on disk for the segment it has stored on one of its volumes.

Next, in step 436 erasure coding volume hints will be determined and stored for each segment. For example, the volume identifier where segment 216 is stored will be written into the system metadata for segment 214, thus ensuring that in a ring-like fashion, each segment stores the likely volume identifier for the next segment. Preferably, volume hints are transmitted from the SAN when each segment is written using a POST request. In addition, volume hints may also be written into the journal of each volume. In other words, once an erasure set has been written to any of a number of nodes, the journal entry for a particular volume where a given segment has been stored will be updated to include the volume identifier where the next segment of the object is stored.

Step 440 determines whether there is more data from the digital object to write into the storage cluster. If so, then in step 444 a new erasure set is begun. In this situation, the SAN will request write bids from entire cluster in order to determine the next M nodes that will accept the writing of data and parity segments to their volumes. Control then moves to step 416 in order to write the next erasure set for this digital object.

If there is no more data to write, then in step 448 the manifest for this erasure set is written. As shown in FIG. 3, the manifest will include a metadata section and a section for each of the erasure sets. A unique identifier (hash value, random number, etc.) is calculated for each segment of each erasure set and stored in section 350, for example. This unique identifier may be calculated in step 416 or later (in the case of a random number), or in step 428 or later (in the case of a hash value). The manifest will be written to any node of the cluster and treated like any stream written to the storage cluster. In other words, a unique identifier will be calculated for the manifest and the manifest will be replicated to different nodes within the cluster. Preferably, the manifest will be replicated a total of P+1 times within the cluster. Finally, the unique identifier for the manifest is returned to the client application so that the client application may access its digital object in the future when performing a read operation.

Read Digital Object from Cluster

Figure 5:
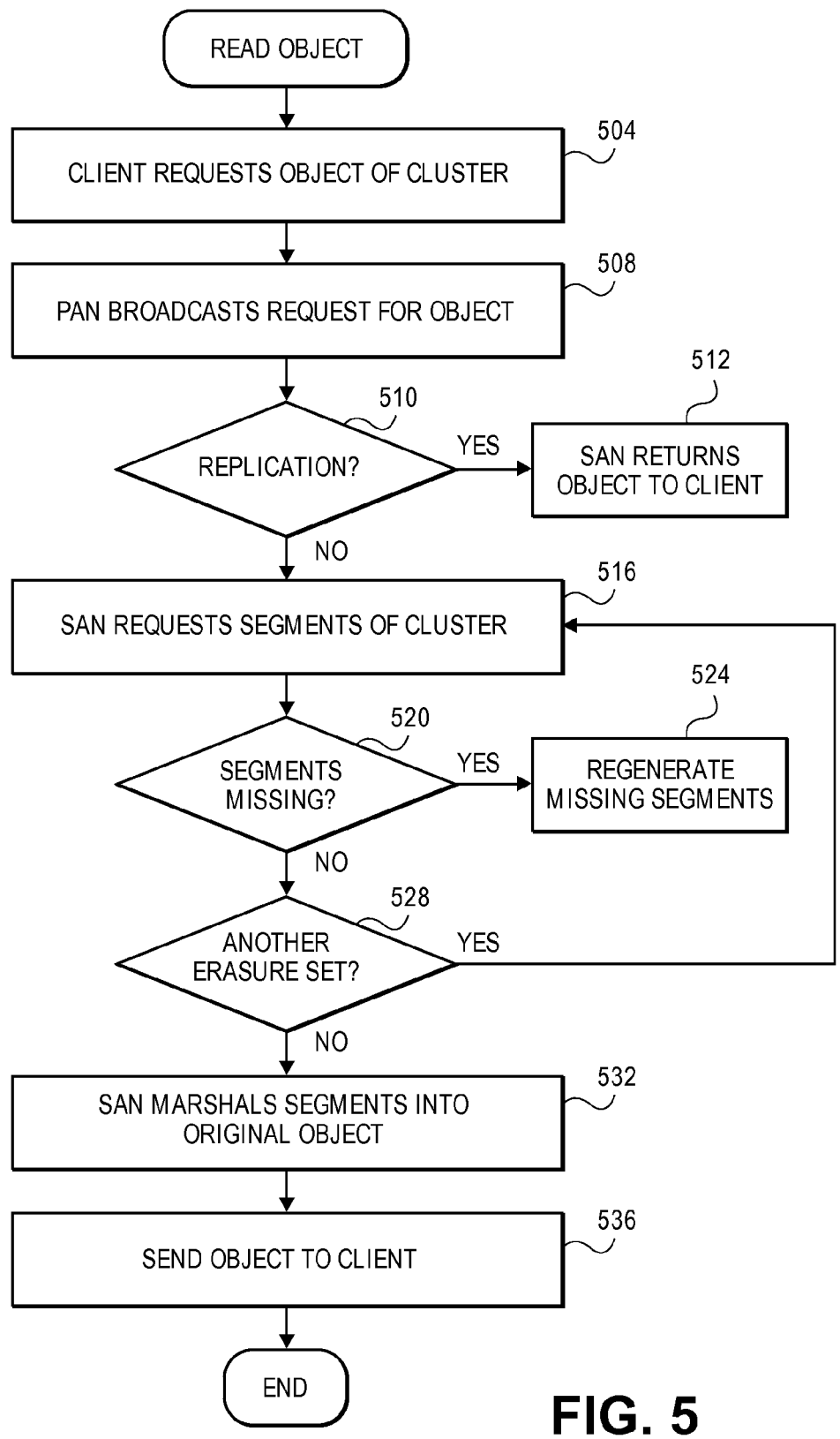
FIG. 5 is a flow diagram describing how a client application reads a digital object from the storage cluster.

FIG. 5 is a flow diagram describing how a client application reads a digital object from the storage cluster. Advantageously, the client application need not be aware of which technique (replication or erasure coding) the storage cluster is using to store the digital object. By simply using a unique identifier for the digital object (previously supplied by the storage cluster), the client application may retrieve the object from the cluster without needing to rely upon any outside database or control system. In fact, the client application will be unaware if the unique identifier represents the object which has been replicated within the cluster, or represents a manifest indicating that erasure coding has been used to store the object in the cluster.

In step 504 the client application may make a request of the storage cluster to return a particular digital object identified by a unique identifier. This may be implemented using an SCSP GET request or a similar HTTP protocol. The client application supplies the identifier to any node of the storage cluster (which becomes the primary access node). Next, in step 508 the PAN broadcast a message to all nodes within the cluster looking for an object having that particular unique identifier. At this point, it is also transparent to the PAN whether or not the unique identifier represents the actual object or a manifest.

Because both actual objects and manifests will be replicated within the storage cluster, the PAN will receive a number of responses to its broadcast request. In one embodiment, each node having a copy of the object (or of the manifest) calculates a read bid (the cost to read the digital object); the PAN chooses the node with the lowest read bid, redirects the client application to that node, and that node then becomes the secondary access node (SAN). The SAN will be aware of whether replication or erasure coding has been used by looking at the system metadata of the found object (either the actual object or the manifest of the object).

Accordingly, in step 510 the SAN determines whether it is holding the actual digital object (because replication had been used) or whether it is holding the manifest for the actual digital object (because erasure coding had been used). If replication had been used, then in step 512 the SAN may simply return the digital object to the requesting client application and the method ends. Alternatively, if erasure coding had been used and the SAN is holding the manifest, then in step 516 the SAN begins the process of requesting the segments of cluster in order to reassemble the requested digital object. Using the metadata of the manifest, the SAN is aware of the erasure coding algorithm used and the specific erasure coding (e.g., 5:7). Preferably, since only the first K data segments are necessary to reassemble the digital object, the SAN broadcasts a request for only the first K data segments using the unique identifiers found in section 350 of the manifest. If successful, then control moves to step 528.

If, however, any these first K data segments are missing (step 520), then a request will be broadcast for any needed parity segments. For example, if two of the original data segments are missing, then a request must be broadcast for two of the parity segments using the unique identifiers from the manifest. If the needed number of parity segments are found, then in step 524 the missing data segment (or segments) is regenerated using the appropriate erasure coding algorithm and the found parity segments. In one embodiment, the hash value of the missing segment may be computed and compared to the original. Or, it is also possible to verify the data for each stripe by using a generated block as input with blocks from segments 1 to (K−1) to generate block K and compare that block against the original. If, though, K segments cannot be found, then an error message is returned to the client application.

Assuming that K segments are either found or generated, then in step 528 the SAN determines (using the manifest) whether there is a another erasure set to be obtained. If not, then control moves to step 532. If so, then control moves to step 516 and the SAN begins the process of requesting the necessary segments of the second erasure set using the unique identifiers found in the corresponding section for the second erasure set of the manifest. In step 532 and 536 the SAN marshals the data and/or parity segments for each erasure set it has retrieved in order to reconstruct the original data object. For example, when the necessary K segments are found on nodes within the cluster, the SAN reads the data from these segments into its memory and applies the appropriate erasure coding algorithm in order to reconstruct the original digital object on the SAN. Preferably, as each stripe of the object is retrieved or reconstructed, this data is fed byte-by-byte via HTTP back to the client application. Should there be more than one erasure set, the SAN reconstructs the next portion of the digital object using the next erasure set, and feeds back the bytes of the next erasure set to the client application. Alternatively, the SAN may assemble the entire object within its own memory before sending the object back to the client.

Recovery from Volume Failure

Figure 6:
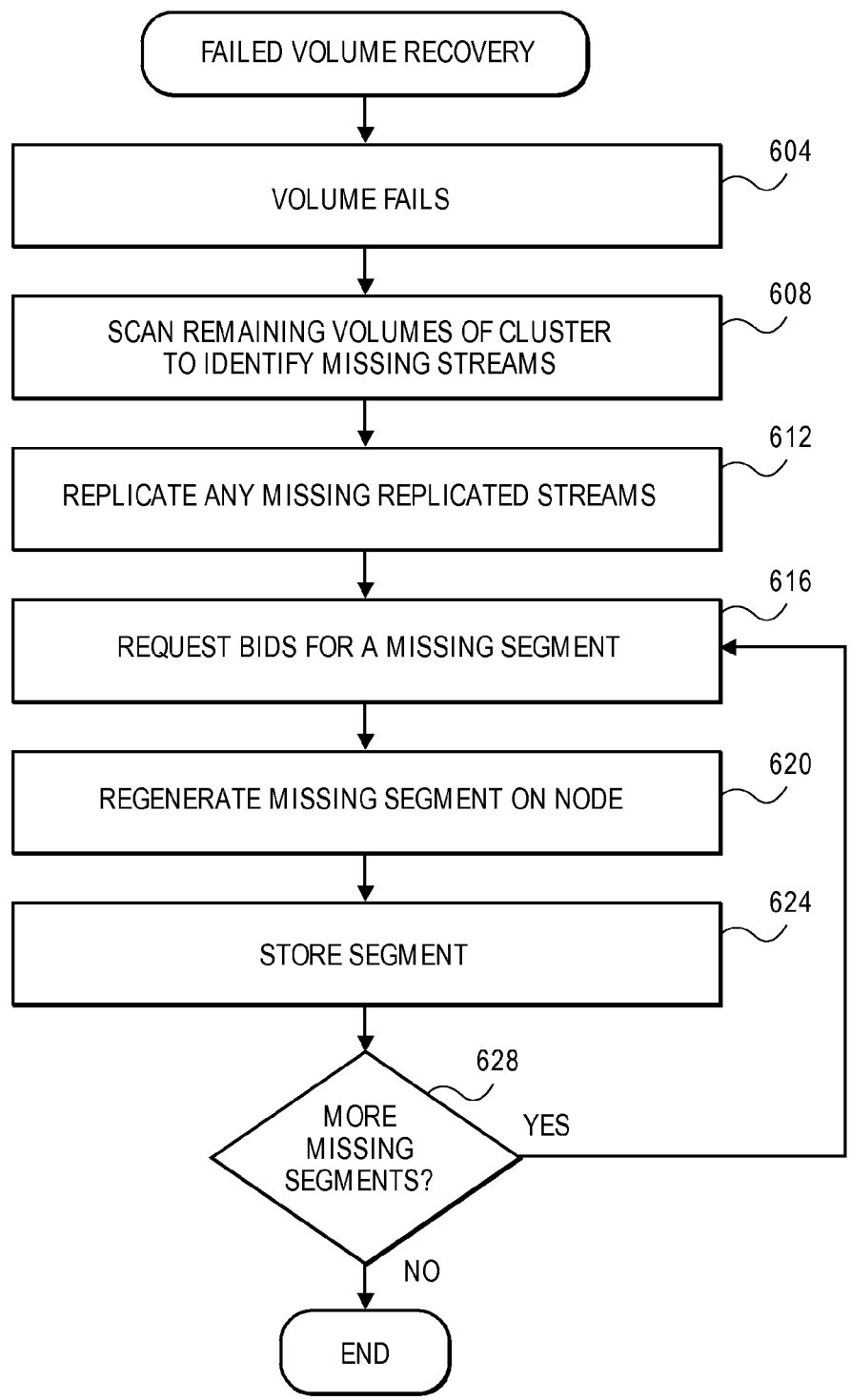
FIG. 6 is a flow diagram describing how a storage cluster may recover from a volume failure.

FIG. 6 is a flow diagram describing how a storage cluster may recover from a volume failure. As mentioned above, a storage cluster includes any number of computer nodes, each node having any number of hard disks or solid-state disks, referred to as volumes. A storage cluster typically achieves data redundancy by storing different replicas of an object on different nodes (when replication is used), and by storing the various data and parity segments of an object on different nodes (when erasure coding is used). Consequently, if a disk of a node fails, many of the replicas and segments of any number of objects will be lost, thus degrading the purported data redundancy of the entire storage cluster. Further, the quality of a storage cluster is judged not only by how many volumes it can afford to lose, but how fast the cluster can recover the missing data when a volume fails. Accordingly, FIG. 6 presents a technique that not only handles failed volume recovery when there exists a mix of objects stored using replication (replicas) and erasure coding (segments), but also recovers missing segments as quickly as possible. Should an entire node fail, then the below technique is performed for each volume on the node that has failed.

In step 604 a node of the cluster notices that one of its disks has failed. In one instance, once a node has communicated with a volume in the normal course of business, the node will expect to hear from that volume periodically. If not, the node will broadcast a message to all of its volumes looking for the missing volume. If there is no response, then the node assumes that the volume has failed. In another instance, the storage cluster may be entirely shut down due to maintenance, moving of the cluster, etc. When the cluster is brought back up, it is possible that a volume will fail but the node may not notice since it has not heard from the volume before. In this situation, the health processing module of the node can assist. The health processing module periodically checks the integrity of all streams on each volume; when it detects a volume hint (the unique identifier of the volume) of a particular stream it will look for that volume. If not found, the node will again assume that the volume has failed. Other techniques for detecting that a volume has failed may be used.

Next, in step 608, once the unique identifier of the volume that has failed has been obtained, each node within the cluster is directed to scan all of its functioning volumes in order to identify streams that include a volume hint for the missing volume. Preferably, the node that has identified its missing volume sends a broadcast message (including the volume identifier) to all other nodes requesting a search for streams that have a hint for the missing volume. Also, the nodes will perform the search in parallel for efficiency. In one embodiment, the journal that each volume has recorded on disk is scanned and each stream representation is analyzed to determine the volume hint that it contains. Because each stream representation in the journal that represents a segment of an erasure-coded object includes the volume identifier for the next segment, any such identified stream that include the volume identifier for the missing volume will also indicate a segment that was on the missing volume. For example, if the stream representation of segment 222 of FIG. 2 includes a volume hint that is the volume identifier for the missing volume, this means that segment 210 was on that volume and needs to be regenerated. In addition, representation of a replicated stream in the journal will include volume hints indicating the volume identifiers for all of the replicas of that stream. For each stream, the journal typically includes type information indicating whether the stream represents a replicated object or an erasure-coded object.

In another embodiment, these volume hints may be stored in the system metadata 280 of a segment (or the metadata of a replicated stream). For example, the system metadata for segment 216 includes a volume hint indicating the volume identifier where segment 218 is stored. It may be possible for each node to scan its volumes looking for the system metadata of each stream on disk, although this technique will be slower. The volume hint may then be read from this system metadata. Again, a volume hint in a particular segment indicating the failed volume indicates that the next segment is missing. When the node identifies that a segment is missing, it can determine the unique identifier for that missing segment by looking at the metadata 280 of the previous segment and retrieving the unique identifiers for all sibling segments. In order to find any segments necessary for regenerating a missing segment, these unique identifiers of the sibling segments may be used.

Once each node has finished scanning its journals (or its streams on disk) each node will have a list of the missing streams that had been on the failed volume. Because the storage cluster includes objects stored using replication and erasure coding, some of these missing streams represent replicated objects, while some of the streams represent missing segments of an erasure-coded object.

For missing replicated streams (if any), in step 612 each node replicates a missing stream by requesting bids from the other nodes to replicate the stream and then transfers control to the chosen node. Assuming that at least one segment of an erasure-coded object is missing from a given node, in step 616 (using the unique identifiers obtained in step 608) the given node requests the other nodes to bid for which nodes can supply the K segments necessary to regenerate the missing segment. Once the winning bids are received and the nodes are identified that can supply the K segments, the given node requests bids for a node to regenerate and store the missing segment.

Accordingly, in step 620 the given node requests bids from nodes within the cluster for a particular node to regenerate the missing segment. Once this node is chosen, the node regenerates the missing segment using the K segments identified in step 616. This regeneration may be performed using the appropriate erasure coding algorithm. In one embodiment, regeneration of the missing segment consumes data in stripes from the K segments while the destination stripe is computed and written in order to regenerate the missing segment.

In step 624 the node stores the segment on one of its volumes. If there are any more missing segments identified by the given node, then control moves to step 616 and the node again requests bids for the missing segment as previously described. Since each node within the cluster will be scanning its volumes in step 608 looking for missing streams, each node will also be performing steps 612 through 628 in parallel, assuming that each node has identified missing streams.

Relocation of Erasure Coded Segments

Once a segment has been written to the storage cluster and provided with a unique identifier, it may be managed as any other stream in the cluster, including replicated streams. In other words, the health processing module may see fit to move a segment from one volume to another, or from one node to another, independent of the other segments in an erasure set and without any loss of availability of the segment being moved. For example, should segment 218 be moved to different volume, the volume hint in segment 216 will be updated to indicate the new volume for segment 218. When segment 218 is relocated the system is aware of all of its sibling segments (and their unique identifiers) because the metadata 280 of segment 218 includes the unique identifiers of all sibling segments, in order. The upstream segment, segment 216, may be retrieved from within the cluster using its unique identifier, and, once the new volume identifier for segment 218 is known, this new volume identifier may be written into the metadata section 280 of segment 216 as a volume hint for the new location of segment 218. Alternatively, the stream representation of segment 216 in its journal may be updated to include the new volume identifier.

This updating of the volume hint for a relocated segment may be performed as relocation occurs or may be performed at a later time by the health processing module. The advantage of this updating is that segments may be relocated within the cluster with no loss of availability and without the need for any extra control computer or control database to track segments within the cluster.

Conversion of an Erasure-Coded Object to Replication and Vice-Versa

One embodiment of the present invention is able to convert a digital object stored within the cluster from one format to another. For example, an object stored using an erasure coding of 5:7 may be converted to a coding of 6:10, an erasure-coded object may be converted to storage using replication, and an object stored using replication may be converted to storage using erasure coding. Whether to convert an object to a different format and when to do that may be dictated by object metadata, storage cluster default settings, or a combination of both.

As mentioned above, the user metadata provided with an object from a client application can provide information as to how an object should be stored, and may also dictate when the object should be converted to one format or another, as described immediately above. For example, the user metadata may dictate that within a specific time frame, or at a particular future time, that the object should be converted to different format. Or, storage cluster settings and rules may also dictate that objects shall be converted at a particular time or times, that objects of a certain size shall be converted periodically or at a particular time, or that a certain percentage of objects shall be converted. The cluster may even accept manual inputs from an administrator that change cluster settings or that dictate how and when conversion should happen for an object or objects within the cluster. A special conversion module may be used for performing conversion, or such functionality may be incorporated into the health processing module of the cluster.

Figure 7:
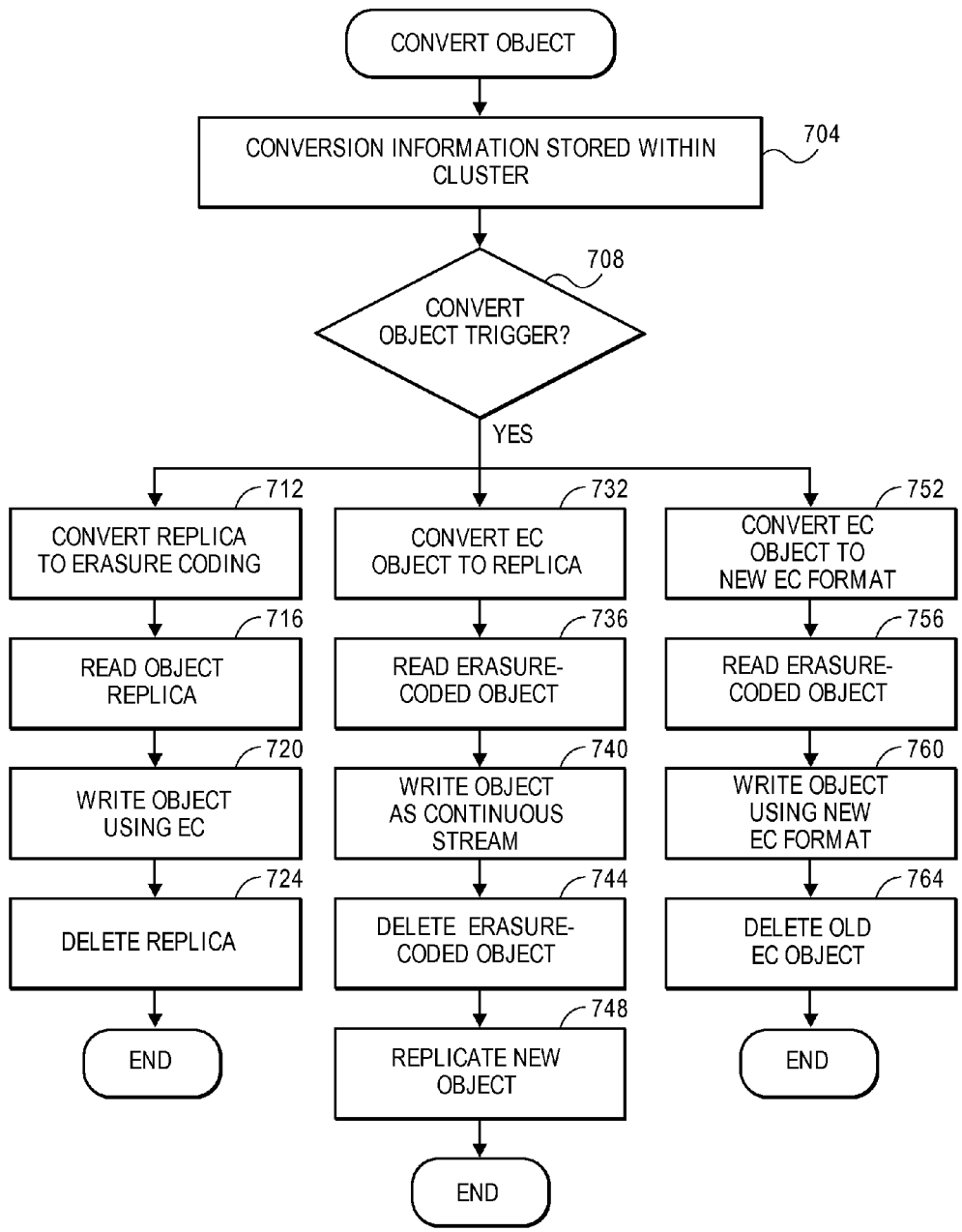
FIG. 7 is a flow diagram describing how object may be converted from one format to another.

FIG. 7 is a flow diagram describing one embodiment in which an object in a storage cluster may be converted from one storage format to another. Although this diagram deals with a single object, any number of objects within the cluster may be converted using this technique. The unique identifier for the object within the cluster remains the same so that the client application may retrieve the object using the same unique identifier it was originally provided with. For an object having a random number as its unique identifier, this random number remains the identifier for the object after conversion. In the case where a client application supplies a unique name for an object, the cluster may use a hash value of the name as the unique identifier, and this hash value remains the identifier after conversion.

The concept of versions of objects facilitates retaining the original unique identifier for the new, converted object. Each object includes a timestamp indicating when it was created; when an object is converted, it will have the same unique identifier as the original object, and the new object is given a timestamp later than the original. In this fashion, both unique identifiers may exist within the cluster at the same time, yet the cluster is aware of which object is the current, valid object by referencing the timestamps. An object having an earlier timestamp than its twin may be deleted at any time as it is not needed.

In step 704 relevant conversion information for an object (or for any number of objects) is stored within the storage cluster. As mentioned above, each object may be received from a client application with user metadata dictating how an object should be converted, when an object should be converted, etc. This user metadata is stored along with each object when the object is written to the cluster. This metadata is stored in the manifest of erasure-coded objects.

Additionally, storage cluster settings and rules may dictate default conversion settings for objects within the cluster. These settings and rules may be stored in a designated object of the cluster, or may be included in the information provided the node during its startup, or may be provided by a designated source on the network where the node runs. For example, settings may require that all objects be converted from one erasure coding format to another by a particular date, may require that once the objects reach a certain age, may require conversion from replication to erasure coding for all objects over a period of time, may require that objects over a certain size be converted to erasure coding by a particular age or date (or gradually over a period of time), etc. Moreover, an administrator may input settings or commands dictating how and when conversion should occur for an object or objects.

In step 708 a triggering condition is detected for a particular object indicating that the object should be converted from one format to another. This triggering condition may be detected in many different manners. For example, the health processing module in the course of iterating over objects within the cluster will review the object metadata for a particular object when it touches that object. Should the condition be met (e.g., "convert to erasure coding by or at a particular date using this particular erasure coding format") then the object will be converted as described below. Or, whenever an object is touched or accessed for whatever reason, its user metadata is reviewed to see if the triggering condition is met. Alternatively, the storage cluster itself periodically reviews its cluster settings and rules to determine whether a time or date has passed indicating that an object or objects should be converted according to the cluster settings. Of course, any manual input from the cluster administrator will be acted upon immediately and may indicate a trigger condition.

Step 712 results when the trigger condition indicates that the object (currently stored using replication) should be converted to erasure coding. The unique identifier for the object is obtained (from the object metadata, cluster settings, administrator input, or other) and the cluster determines a node on which a replica of the object exists. In step 716 this node reads the object from one of its disks into memory. Next, in step 720 the node writes the object to the cluster using the particular erasure coding format determined from user metadata, system metadata, cluster settings, or administrator input. This step may be performed as discussed above with reference to FIGS. 4A and 4B, specifically, steps 416-448. This new object written with erasure coding is supplied with the same unique identifier for its manifest as the unique identifier used for the original replica read in step 716. In step 724 the original object and any replicas may be deleted, either immediately or later by the health processing module. The health processing module determines that any replicas having a unique identifier with an earlier timestamp than the newly converted object may be deleted.

Step 732 results when the trigger condition indicates that the object (currently stored using erasure coding) should be converted to storage using replication. The unique identifier for the object is obtained (from the object metadata, cluster settings, administrator input, or other) and the cluster determines a node on which the manifest for the erasure-coded object exists. In step 736 this node reads the object from the cluster into memory. This step may be performed as discussed above with reference to FIG. 5, specifically, steps 516-532. Next, in step 740 this node writes the object as a continuous stream (rather than as erasure-coded segments) to a node of the cluster. This write may be performed, for example, by broadcasting a request for write bids throughout the cluster, and then writing a stream to the node with the winning bid. Or, other techniques may be used to choose a particular node or desk to which to write the object. This new object written as a single stream is supplied with the same unique identifier as the unique identifier used for the original manifest read in step 736. In step 744 the original object may be deleted, either immediately or later by the health processing module. The health processing module determines that any manifest (and its associated segments) having a unique identifier with an earlier timestamp than the newly converted object may be deleted. In step 748 the newly written object may be replicated to create any number of replicas within the cluster and this replication may occur immediately or over time as the health processing module iterates over this object.

Step 752 results when the trigger condition indicates that the object (currently stored using an old erasure coding) should be converted to a new erasure coding. The unique identifier for the object is obtained from the object metadata and the cluster determines a node on which the manifest for the erasure-coded object exists. In step 756 this node reads the object from the cluster into memory. This step may be performed as discussed above with reference to FIG. 5, specifically, steps 516-532. Next, in step 760 the node writes the object to the cluster using the new erasure coding format determined from user metadata, system metadata, cluster settings, or administrator input. This step may be performed as discussed above with reference to FIGS. 4A and 4B, specifically, steps 416-448. This object written with new erasure coding is supplied with the same unique identifier for its manifest as the unique identifier used for the original object read in step 756. In step 764 the original object may be deleted, either immediately or later by the health processing module. The health processing module determines that any manifest having a unique identifier with an earlier timestamp than the newly converted object may be deleted.

Management of Digital Objects Across Clusters

Another embodiment of the present invention is able to move a digital object from one storage cluster to another storage cluster, and convert the object to the format required by the new cluster or to that required in the object's user metadata. For example, an object stored using an erasure coding of 5:7 in a first cluster may be converted to a coding of 6:10 when moved to a second cluster, an erasure-coded object may be converted to storage using replication when moved to the second cluster, or an object stored using replication in a first cluster may be converted to storage using erasure coding when moved. Whether to convert an object to a different format may be dictated by the user metadata, storage cluster default settings, a combination of both, an instruction from an outside software product, or a cluster administrator. Advantageously, the unique identifier of the object in the first cluster is also retained for use within the second cluster.

Figure 8:
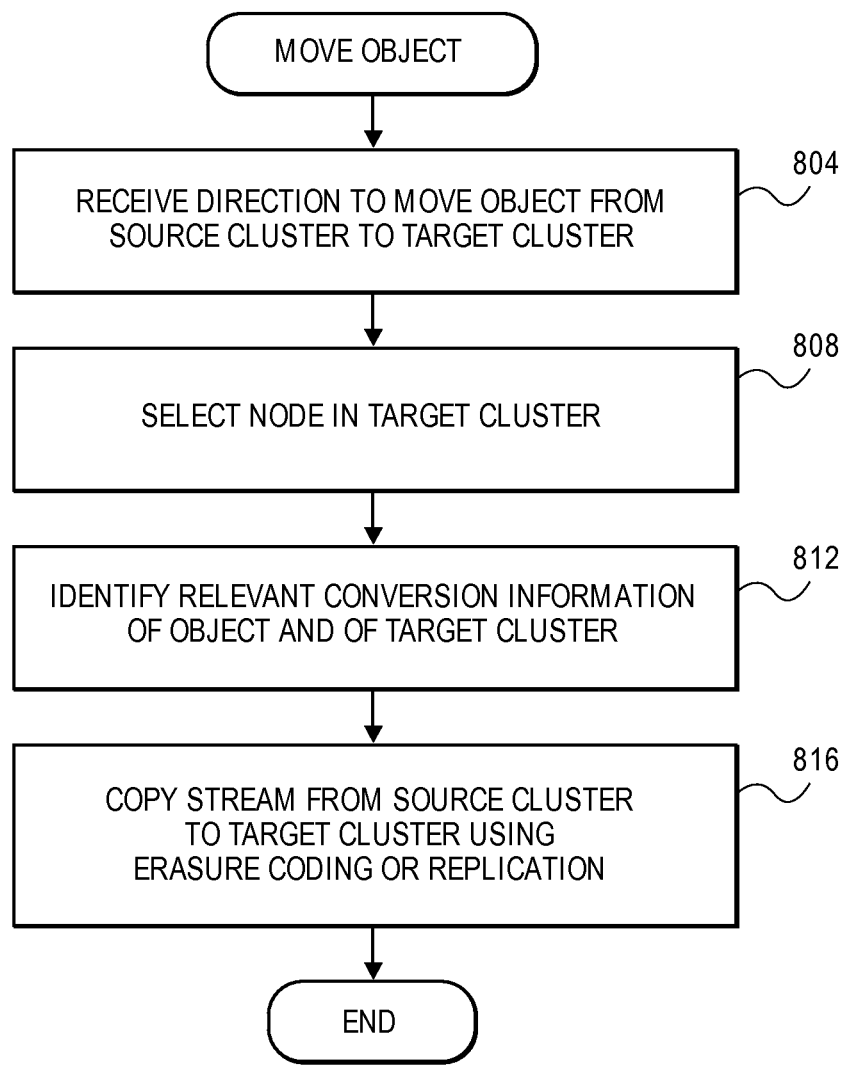
FIG. 8 is a flow diagram describing how management across storage clusters may be performed.

FIG. 8 is a flow diagram describing one embodiment in which an object in one storage cluster may be moved to a second storage cluster and converted from one storage format to another. Although this diagram deals with a single object, any number of objects within a cluster may be moved using this technique. Preferably, the unique identifier for the object within the first cluster remains the same for the object in the second cluster so that a client application may retrieve the object using the same unique identifier from the second cluster. For example, the unique identifier may be a random number or a hash value of the object's name supplied by a client application.

In step 804 and instruction is produced to copy (or move) and object from a source cluster into a target cluster. The object may be copied into the target cluster for backup purposes (leaving the original in the source cluster) or the object may simply be moved into the target cluster and the original deleted. The instruction may originate from any outside software product, a client application, from within the cluster itself, or from a cluster administrator. In one embodiment, the "Content Router" software product available from Caringo Inc., is used to generate an instruction to replicate an object from a source cluster into a target cluster. The instruction includes an identification of the object to be replicated, such as its unique identifier within the source cluster.

The object may be copied from the source cluster in many different ways. For example, the source cluster may read the object and then "push" it to the target cluster, or, the target cluster may "pull" the object from the source cluster. In one embodiment, in step 808 a target node is first selected in the target cluster to perform the write of the object within the target cluster. The target node may be selected randomly, by using a bid process, or other technique. Once selected, the target node is provided with the unique identifier for the object to be copied and contact information for the source cluster. For example, the target node may be provided with a communication address for the source cluster overall, with an address of a central or coordinating node within the cluster, or preferably, an IP address of any node within the source cluster.

In step 812 any relevant conversion information is identified within the target cluster. For example, any default settings or rules that specify how the copied object should be stored within the target cluster (i.e., using replication or erasure coding) are identified. If no default settings are relevant then the conversion information may be taken from the user metadata contained within the object to be copied. Alternatively, the instruction to copy the object may include the conversion information.

In step 816 the object is copied from the source cluster to the target cluster. The target node initiates copying of the object by contacting any node of the source cluster using the IP address provided and provides the unique identifier for the object. The object may then be communicated from the source cluster to memory of the target node. This step may be performed, for example, as explained above with reference to FIG. 5, where the target node is acting as the client application. Once the target node receives the object (or as the target node is received and the object) it will write the note into the target cluster using the appropriate conversion information that has been determined above. In other words, the object will be written as a continuous stream (replication) or will be written using erasure coding. For example, this write step may be performed as described above with reference to FIGS. 4A and 4B where the target node acts as the secondary access node. For replication, the target node may solicit bids from the other nodes within the target cluster, or may write the object to one of its own disks. In the case of erasure coding, the segments will be written to various nodes within the target cluster. Preferably, the copied object in the target cluster retains the same unique identifier it had in the source cluster. Once the object has been copied to the target cluster, it may be retained in the source cluster or deleted at a future time.

Computer System Embodiment

Figure 9A:
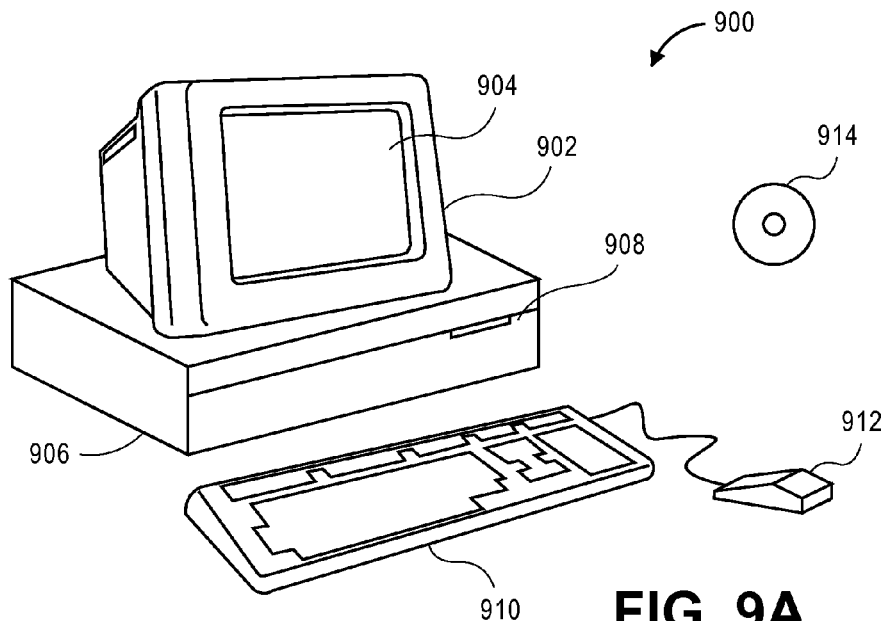
FIGS. 9A and 9B illustrate a computer system suitable for implementing embodiments of the present invention.
Figure 9B:
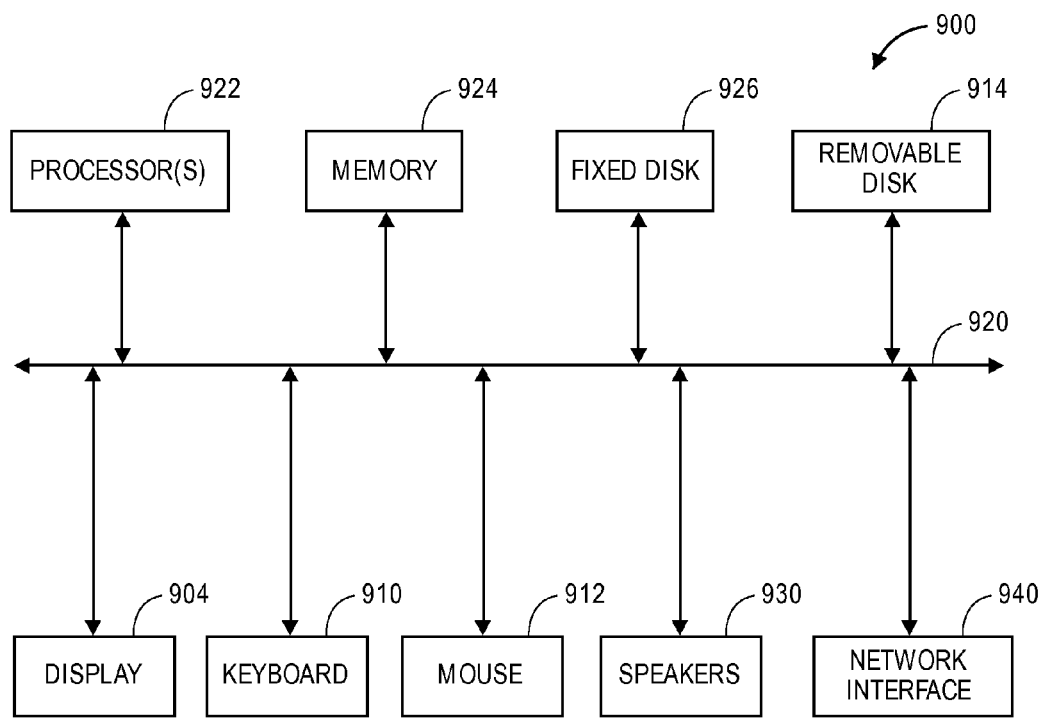

FIGS. 9A and 9B illustrate a computer system 900 suitable for implementing embodiments of the present invention. FIG. 9A shows one possible physical form of the computer system. Of course, the computer system may have many physical forms including an integrated circuit, a printed circuit board, a small handheld device (such as a mobile telephone or PDA), a personal computer or a super computer. Computer system 900 includes a monitor 902, a display 904, a housing 906, a disk drive 908, a keyboard 910 and a mouse 912. Disk 914 is a computer-readable medium used to transfer data to and from computer system 900.

FIG. 9B is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher-level code that are executed by a computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

We claim:

1. A method of storing a digital object in a storage cluster, said method comprising:
   receiving from a client application a request at a computer node of said storage cluster to store said digital object;
   determining whether to store said digital object in said storage cluster using replication or erasure coding;
   when it is determined to store said digital object using erasure coding, writing said digital object to a plurality of computer nodes of said storage cluster using erasure coding, said digital object being stored as a plurality of segments;
   creating a manifest computer file that includes an indication of said erasure coding and a unique identifier within said storage cluster for each of said segments;
   storing said manifest computer file on a computer node of said storage cluster; and
   returning a manifest unique identifier identifying said manifest computer file to said client application.

2. A method as recited in claim 1 further comprising:
   determining whether to store said digital object using replication or erasure coding by reference to an inherent property of said digital object, an instruction from said client application, or metadata of said digital object.

3. A method as recited in claim 1 further comprising:
replicating said manifest computer file within said storage cluster and not storing said manifest computer file using erasure coding.

4. A method as recited in claim 1 further comprising:
not replicating said digital object within said storage cluster.

5. A method as recited in claim 1 further comprising:
for each segment stored on a disk of said storage cluster, storing on said disk in association with said segment a unique identifier of a next disk that stores another segment of said digital object.

6. A method as recited in claim 5 further comprising:
storing said unique identifier of said next disk in association with said segment by storing said unique identifier in a journal entry for said segment on said disk.

7. A method of reading a digital object from a storage cluster having a plurality of computer nodes, said method comprising:
receiving, at one of said computer nodes within said storage cluster, a request from a client application that includes a unique identifier for said digital object;
determining whether said digital object is stored within said storage cluster using replication or erasure coding;
when it is determined that said digital object is stored using erasure coding, reading a manifest stored on a computer nodes of said storage cluster, said manifest being identified by said unique identifier;
identifying a plurality of segments within said storage cluster using unique segment identifiers found within said manifest;
reconstructing said digital object using said segments and an erasure coding algorithm; and
returning said digital object to said client application.

8. A method as recited in claim 7 further comprising:
determining that said digital object is stored using erasure coding by reference to said manifest.

9. A method as recited in claim 7 further comprising:
determining that one of said segments is not present within said storage cluster; and
regenerating said segment not present using other of said segments and an erasure coding algorithm.

10. A method as recited in claim 7 further comprising:
identifying a first disk where one of said segments is stored; and
reading a disk identifier for a second disk where another of said segments is stored, said disk identifier being stored in association with said one of said segments on said first disk.

11. A method as recited in claim 7 further comprising:
identifying a second erasure set within said manifest, said second erasure set including a plurality of second unique segment identifiers; and
reconstructing said digital object using said segments, a plurality of second segments identified by said second unique segment identifiers, and said erasure coding algorithm.

12. A method as recited in claim 7 wherein said manifest is replicated within said storage cluster and wherein said manifest is not stored within said storage cluster using erasure coding.

13. A method as recited in claim 7 wherein said digital object is not replicated within said storage cluster.

14. A method of recovering from a failed disk, said method comprising:
detecting within a storage cluster having a plurality of computer nodes that a first disk of one of said plurality of computer nodes has failed;
scanning a persistent storage area of a second disk of said storage cluster to find a unique identifier of said failed disk, said unique identifier in association with a digital stream of said storage cluster;
determining whether said digital stream is stored within said storage cluster using replication or erasure coding;
when it is determined that said digital stream is stored using erasure coding, identifying a missing segment previously stored on said failed disk;
locating a plurality of other segments within said storage cluster, said plurality of other segments including said digital stream;
regenerating said missing segment previously stored on said failed disk using said plurality of other segments and an erasure coding algorithm; and
storing said regenerated segment on a computer node of said storage cluster.

15. A method as recited in claim 14 further comprising:
scanning a metadata section of said digital stream to find unique identifiers for said plurality of other segments.

16. A method as recited in claim 14 further comprising:
scanning said persistent storage area of said second disk includes scanning a journal entry for said digital stream.

17. A method as recited in claim 16 further comprising:
determining whether said digital stream is stored using erasure coding by reference to said journal entry.

18. A method as recited in claim 14 further comprising:
identifying said missing segment previously stored on said failed disk before receiving a request from outside the storage cluster for a digital object that is stored within said storage cluster using erasure coding that includes said missing segment.

19. A method as recited in claim 14 wherein said missing segment is not replicated within said storage cluster.

20. A method of relocating a segment within a storage cluster, said method further comprising:
identifying a segment on a first disk of a computer node within a storage cluster, said segment being one of a plurality of segments representing a digital object stored within said storage cluster;
relocating said segment from said first disk to a second disk of said storage cluster, said second disk being identified by a second unique disk identifier;
retrieving from metadata of said segment a unique identifier for a sibling segment of said plurality of segments, said sibling segment including in its metadata a first unique disk identifier for said first disk;
locating said sibling segment within said storage cluster using said unique identifier; and
replacing said first unique disk identifier for said first disk within said metadata of said sibling segment with a second unique disk identifier for said second disk, whereby said metadata of said sibling segment indicates said second disk to where said segment has been relocated.

21. A method of converting a digital object within a storage cluster, said method comprising:
storing said digital object within said storage cluster on a single disk of a computer node as a continuous stream of bits, said digital object having a unique identifier within said storage cluster;

after said storing, identifying metadata of said storage cluster indicating a requirement to convert said digital object to an erasure coding storage format;
reading said digital object from said single disk using said computer node of said storage cluster;
writing said digital object to a plurality of disks of said storage cluster using said erasure coding storage format; and
retaining said unique identifier for said digital object written in said erasure coding storage format, whereby a client application may retrieve said digital object written in said erasure coding storage format using said unique identifier.

22. A method of converting a digital object within a storage cluster, said method comprising:
storing said digital object within said storage cluster in a first erasure coding storage format, said digital object having a unique identifier within said storage cluster;
after said storing, identifying metadata of said storage cluster indicating a requirement to convert said digital object to a second erasure coding storage format;
reading said digital object from said storage cluster using a computer node of said storage cluster;
writing said digital object to said storage cluster using said second erasure coding storage format; and
retaining said unique identifier for said digital object written in said second erasure coding storage format, whereby a client application may retrieve said digital object written in said second erasure coding storage format using said unique identifier.

23. A method of converting a digital object within a storage cluster, said method comprising:
storing said digital object within said storage cluster in an erasure coding storage format, said digital object having a unique identifier within said storage cluster;
after said storing, identifying metadata of said storage cluster indicating a requirement to convert said digital object to a storage format using replication;
reading said digital object from said storage cluster using a computer node of said storage cluster;
writing said digital object to a single disk of a computer node of said storage cluster as a continuous stream of bits; and
retaining said unique identifier for said digital object written as said continuous stream of bits, whereby a client application may retrieve said digital object written as said continuous stream of bits using said unique identifier.

24. A method of copying a digital object from a source storage cluster to a target storage cluster, said method comprising:
receiving an instruction at a target node of said target storage cluster to copy said digital object from said source storage cluster to said target storage cluster, said instruction including an address of a source node of said source storage cluster;
determining a target conversion format into which said digital object will be stored in said target storage cluster;
reading said digital object from said source storage cluster, said digital object being stored in a source conversion format and having a unique identifier within said source storage cluster; and
storing said digital object in said target storage cluster using said target conversion format, said digital object being stored using said unique identifier.

25. A method as recited in claim 24 wherein said target conversion format is different from said source conversion format.

26. A method as recited in claim 24 wherein said source conversion format is replication or erasure coding.

27. A method as recited in claim 24 further comprising:
determining said target conversion format by reference to the metadata of said digital object or by reference to a setting of said target storage cluster.

28. A method as recited in claim 24 wherein said target storage cluster implements a storage format different from said source storage cluster.

* * * * *